United States Patent [19]

Steigerwald

[11] Patent Number: 5,514,921
[45] Date of Patent: May 7, 1996

[54] LOSSLESS GATE DRIVERS FOR HIGH-FREQUENCY PWM SWITCHING CELLS

[75] Inventor: Robert L. Steigerwald, Burnt Hills, N.Y.

[73] Assignee: General Electric Company, Schenectady, N.Y.

[21] Appl. No.: 265,868

[22] Filed: Jun. 27, 1994

[51] Int. Cl.$^6$ ................................................. H01H 36/00
[52] U.S. Cl. ........................... 307/125; 327/108; 327/427; 327/440; 363/98
[58] Field of Search .......................... 307/125; 363/98, 363/20, 98; 327/440, 441, 442, 443, 108, 427, 432, 434

[56] References Cited

U.S. PATENT DOCUMENTS

| | | | |
|---|---|---|---|
| 4,593,204 | 6/1986 | McMurray | 327/442 |
| 4,912,622 | 3/1990 | Steigerwald et al. | 363/98 |
| 4,937,470 | 6/1990 | Zeiler | 307/270 |
| 5,302,862 | 4/1994 | Steigerwald | 307/282 |
| 5,408,150 | 4/1995 | Wilcox | 327/108 |
| 5,430,633 | 7/1995 | Smith | 363/20 |

OTHER PUBLICATIONS

"High–Frequency Switching Circuits Operable in a Natural Zero–Voltage Switching Mode," RL Steigerwald, Ser. No. 08/262,177, (GE Docket No. RD–23,039), filed Jun. 20, 1994.

Primary Examiner—William M. Shoop, Jr.
Assistant Examiner—Albert Paladini
Attorney, Agent, or Firm—Jill M. Breedlove; Marvin Snyder

[57] ABSTRACT

A gate driver circuit, including either a full-bridge or a half-bridge configuration of gate drive switching devices, is capable of applying gate drive signals of variable pulse widths in a substantially loss,less manner to power switching devices of a high-frequency resonant switching converter, while providing transformer isolation between the gate drive electronics and the power switching devices.

6 Claims, 4 Drawing Sheets

LOSSLESS GATE DRIVERS FOR HIGH-FREQUENCY PWM SWITCHING CELLS

RELATED APPLICATION

This application is related to commonly assigned U.S. patent application Ser. No. 08/262,177 of R. L. Steigerwald, filed , Jun. 20, 1994 and incorporated by reference herein.

1. Field of the Invention

The present invention relates generally to power converters and, more particularly, to gate drivers for high-frequency, low-loss switching PWM switching converters, which gate drivers apply gate drive signals of variable pulse widths in a substantially lossless manner.

2. Background of the Invention

Very high frequency lossless gate drivers are usually fully resonant in nature; that is, they generate sinusoidal gate signals. Disadvantageously, with such resonant gate driver circuits, it is difficult to adjust the pulse width for the PWM switching cell topologies, such as resonant flyback, Cuk, buck or boost topologies. Conventional gate drivers used in most PWM switching circuits are lossy in nature and are, therefore, not suitable for very high-frequency operation, e.g., in a range from approximately 1 to 10 MHz.

Accordingly, it is desirable to provide a gate driver circuit for driving the gates of power switching devices, including synchronous rectifiers, with variable pulse widths in a substantially lossless manner and to provide transformer isolation between the control electronics and the gates of the power switching devices.

SUMMARY OF THE INVENTION

A gate driver circuit for a resonant switching converter (e.g., of flyback, Cuk, boost, or buck type), having at least one power switching device, comprises either a full-bridge or half-bridge configuration of gate drive switching devices. A gate drive transformer has a primary winding connected to the gate drive switching devices and a secondary winding connected to the gate of each power switching device of the switching converter. A dc blocking capacitance is connected to the primary winding of the gate drive transformer. The gate drive transformer has a magnetizing inductance designed to store sufficient energy to allow zero-voltage switching of the gate drive switching devices at variable pulse widths when the gate drive switching devices turn off, while the dc blocking capacitance substantially maintains a net zero volt-seconds on the primary winding thereof.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
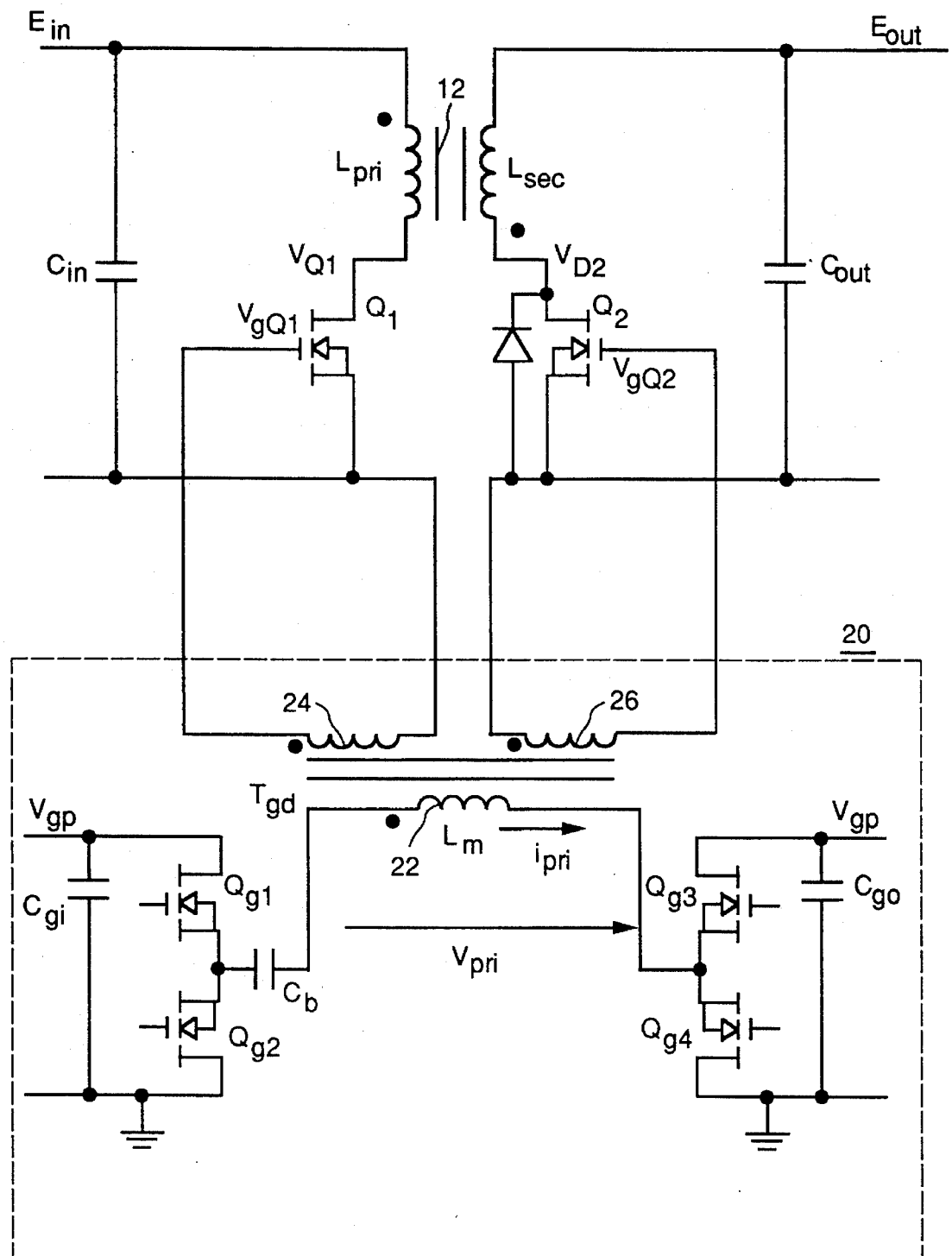
FIG. 1 schematically illustrates a variable pulse width, substantially lossless gate driver circuit in accordance with the present invention.

FIG. 1 illustrates a flyback switching cell 10 comprising a transformer 12 with a primary winding inductance $L_{pri}$ and a secondary winding inductance $L_{sec}$. A primary-side power device (e.g., FET) $Q_1$ is connected in series with the primary winding $L_{pri}$ across an input dc voltage $E_{in}$ and an input filter capacitor $C_{in}$. A secondary-side power switching device $Q_2$ is connected in series with the secondary winding $L_{sec}$. The output dc voltage $E_{out}$ of the switching cell is taken across an output filter capacitor $C_{out}$.

A gate driver circuit 20 according to one embodiment of the present invention is provided for driving switching devices $Q_1$ and $Q_2$ of switching cell 10 with variable pulse widths in a substantially lossless manner. Although the gate driver circuit of the present invention is described and illustrated as driving the switching devices of a resonant flyback switching cell, the gate driver circuit of the present invention may be used to drive other types of switching converter cells, such as, for example, those described in U.S. patent application Ser. No. 08/262,177 of R. L. Steigerwald, cited hereinabove, i.e., resonant buck, resonant Cuk, and resonant boost switching cells.

As illustrated in FIG. 1, gate driver circuit 20 comprises a full-bridge connection of switching devices $Q_{g1}$, $Q_{g2}$, $Q_{g3}$, and $Q_{g4}$, with $Q_{g1}$ and $Q_{g2}$ being connected in series to form one leg (or half-bridge), and $Q_{g3}$ $Q_{g4}$ being connected in series to form the other leg (or half-bridge) of the full-bridge gate driver circuit. The junction between devices $Q_{g1}$ and $Q_{g2}$ is coupled to the junction between devices $Q_{g3}$ and $Q_{g4}$ through a dc blocking capacitor $C_b$ and the primary winding 22 of a gate drive transformer $T_{gd}$. Filter capacitances $C_{gi}$ and $C_{go}$ are shown as being coupled across each series connection of devices $Q_{g1}$–$Q_{g2}$ and $Q_{g3}$–$Q_{g4}$ respectively.

The gate drive transformer $T_{gd}$ is shown in FIG. 1 as comprising a trifilar structure, i.e., three closely coupled windings—a primary winding 22 and two secondary windings 24 and 26. Secondary winding 24 is coupled to the gate of device $Q_1$, and secondary winding 26 is coupled to the gate of device $Q_2$. In accordance with the present invention, gate drive transformer $T_{gd}$ is designed to have a magnetizing inductance $L_m$ to allow for sufficient energy storage to enable zero-voltage switching of the gate drive switching devices when they are turned off.

To drive the gates of $Q_1$ and $Q_2$ with complementary gate signals at an approximately 50% duty cycle, the gate drive transistors, $Q_{g1}$–$Q_{g4}$ are driven as a full bridge; that is, $Q_{g1}$ and $Q_{g4}$ are driven on together for 50% of the time, and $Q_{g2}$ and $Q_{g3}$ are driven on together for 50% of the time. DC blocking capacitor $C_b$ has essentially zero voltage thereacross when $Q_{g1}$–$Q_{g4}$ are driven at 50% duty cycle.

Figure 2:
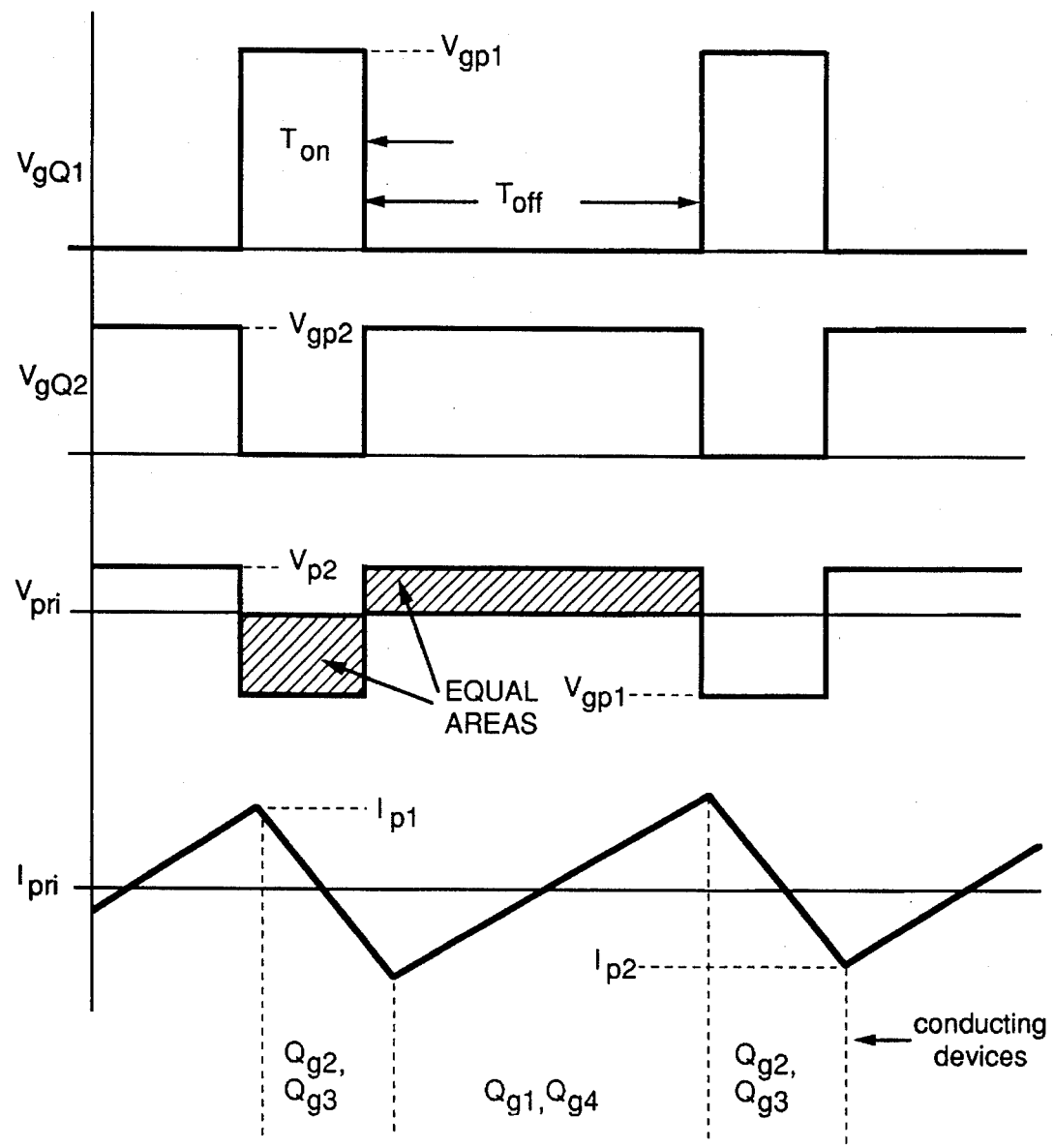
FIG. 2 graphically illustrates voltage and current waveforms for operation of the variable pulse width, lossless gate driver circuit of FIG. 1.

FIG. 2 provides voltage and current waveforms illustrating operation of the gate driver circuit of FIG. 1 for a duty cycle greater than 50%. In particular, FIG. 2 shows the voltage across the gate drive switching devices $V_{gQ1}$ and $V_{gQ2}$, the voltage $V_{pri}$ across the primary winding 22 of the gate drive transformer $T_{gd}$, and the magnetizing current $i_{pri}$ through the gate drive transformer $T_{gd}$. Although the transitions in FIG. 2 are illustrated as being sharp, it is to be noted that they are actually half-period sinusoidal resonant transitions.

In operation, with devices $Q_{g1}$ and $Q_{g4}$ switched on and conducting, the gate capacitance of device $Q_1$ is charged, turning $Q_1$ on. With the gate of $Q_1$ charged, there is no longer load current in the gate transformer's ($T_{gd}$'s) primary or secondary windings. However, magnetizing current $i_{pri}$ builds up in $T_{gd}$'s primary winding 22 and stores energy when $Q_{g1}$ and $Q_{g4}$ are on, as illustrated in FIG. 2. To turn $Q_1$ off, $Q_{g1}$ and $Q_{g4}$ are turned off, which interrupts the magnetizing current $i_{pri}$ built up in $L_m$. However, the magnetizing current continues to flow as it discharges the output capacitances (not shown) of $Q_{g1}$ and $Q_{g4}$, while charging the output capacitances of $Q_{g2}$ and $Q_{g3}$. In addition, the gate capacitance of $Q_1$ is discharged by a fraction of the magnetizing current,—which is reflected to the secondary winding 24, while the gate capacitance of $Q_2$ is charged, as illustrated in FIG. 2. In this manner, the energy stored in the magnetizing inductance $L_m$ serves to zero-voltage switch the gate drive FET's and to reverse the gate voltages on the main power FET's $Q_1$ and $Q_2$ in a substantially lossless manner. Once the gate driver has switched off $Q_1$, the gate drive switching devices $Q_{g2}$ and $Q_{g3}$ are turned on with zero voltage thereacross (i.e., zero-voltage switching), and magnetizing current $i_{pri}$ is built up in the opposite direction to store energy in $L_m$ for the next switching event. In this manner, the gate drive switching losses are minimized. And, advantageously, the gate driver circuit can run at constant frequency while still maintaining zero voltage switching with variable duty cycle. Alternatively, if desired, operation may be at variable frequency.

To change the duty cycle of the gate drive switching devices, the gate drive devices $Q_{g1}$ and $Q_{g2}$ are appropriately driven to deviate from a square wave, as shown in FIG. 2, which illustrates an approximately 75% duty cycle. As the gate drive deviates from a square wave, capacitor $C_b$ charges to the average value created by the drive imbalance. In this manner, the gate drive transformer itself does not saturate; that is, equal volt-seconds are applied during both portions of the duty cycle, as shown in FIG. 2 by the equal area for the primary voltage $V_{pri}$ waveforms. Although the peak gate voltage applied to $Q_1$ and $Q_2$ vary as a function of duty cycle, they are switched efficiently, even with significant variation in the gate drive voltages, as long as the gate drive voltages are maintained sufficiently above the gate threshold voltages for the particular devices.

Figure 3:
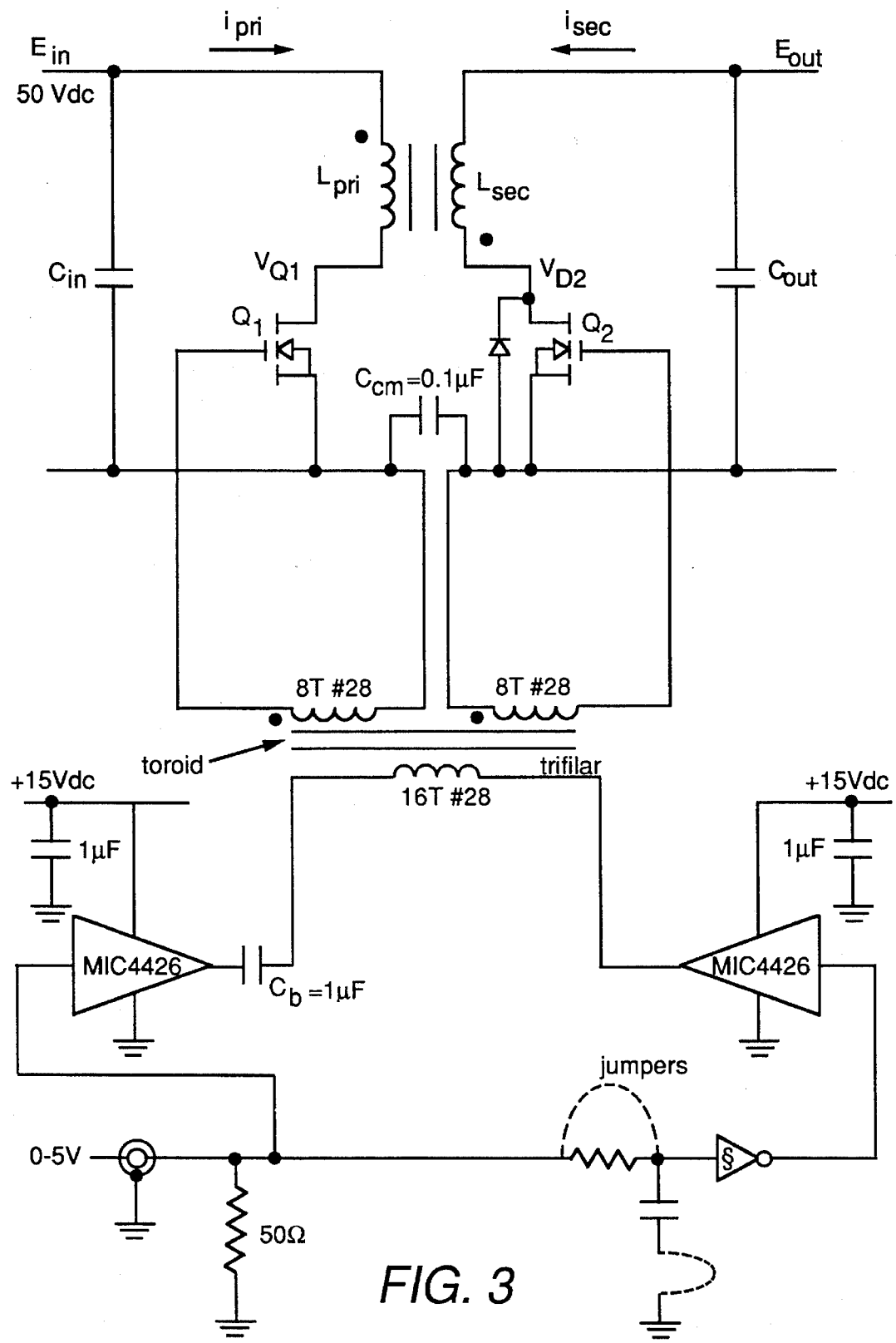
FIG. 3 schematically illustrates an implementation of the gate driver circuit of FIG. 1.

FIG. 3 illustrates an exemplary implementation of the gate driver circuit of FIG. 2.

Figure 4:
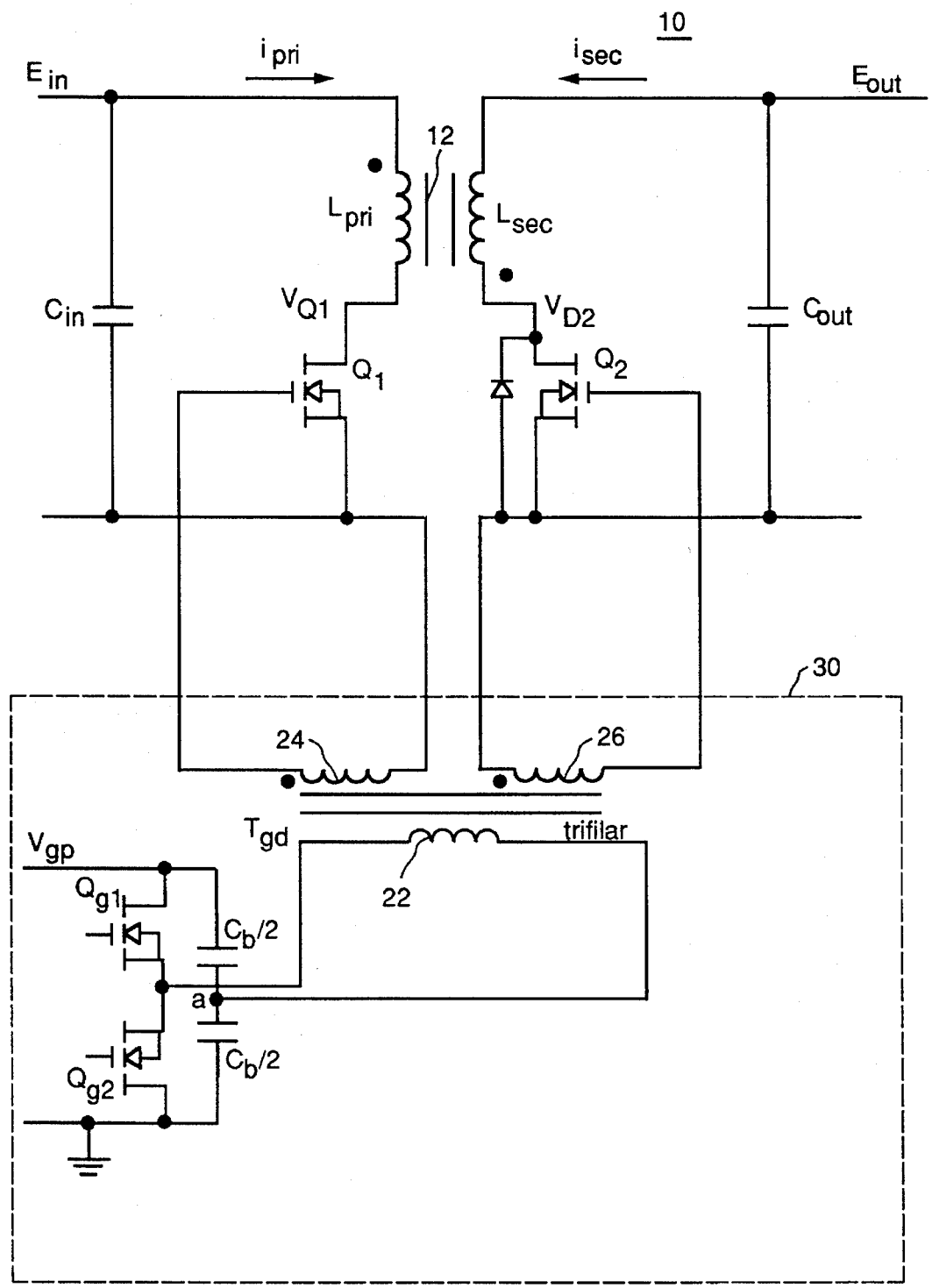
FIG. 4 schematically illustrates an alternative embodiment of a variable pulse width, substantially lossless gate driver circuit in accordance with the present invention.

FIG. 4 illustrates an alternative embodiment of a gate driver circuit 30 according to the present invention comprising a half-bridge configuration of devices $Q_{g1}$ and $Q_{g2}$. For the half-bridge gate driver circuit 30 of FIG. 4, the dc blocking capacitance function is served by two dc capacitors $C_b/2$ coupled together in series across the series connection of switching devices $Q_{g1}$ and $Q_{g2}$. One terminal of the primary winding 22 of the gate drive transformer is connected to the junction between switching devices $Q_{g1}$ and $Q_{g2}$, and the other terminal is connected to the junction a between the capacitors $C_b/2$. In operation, when the on-times of the gate drive devices $Q_{g1}$ and $Q_{g2}$ deviate from a 50% duty cycle, the center point a of the capacitors drifts up or down to maintain a net zero volt-seconds across the gate drive transformer primary winding 22.

Advantageously, a gate driver circuit according to the present invention is capable of applying gate drive signals of variable pulse widths in a substantially lossless manner to power switching devices of a high-frequency switching converter, while providing transformer isolation between the gate drive electronics and the power switching devices.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A gate driver circuit for a switching converter having at least one power switching device, comprising:

at least one pair of gate drive switching devices connected in series in a half-bridge configuration;

a gate drive transformer comprising a primary winding and at least one secondary winding, said primary winding being connected to said gate drive switching devices, said secondary winding being connected to the gate of said power switching device of said switching converter; and a dc blocking capacitance connected to the primary winding of said gate drive transformer;

said gate drive transformer having a magnetizing inductance designed to store sufficient energy to allow zero-voltage switching of said gate drive switching devices at variable pulse widths, said dc blocking capacitance substantially maintaining a net zero volt-seconds on said primary winding of said gate drive transformer.

2. The gate driver circuit of claim 1, comprising two pairs of gate drive switching devices forming a full-bridge configuration, said gate drive transformer having two secondary windings, each of said secondary windings being connected to the gate of one power switching device of said switching converter.

3. The gate driver circuit of claim 1, comprising one pair of gate drive switching devices in a half-bridge configuration, said gate drive transformer having two secondary windings, each of said secondary windings being connected to the gate of one power switching device of said switching converter.

4. The gate driver circuit of claim 1, wherein said gate driver circuit drives said power switching device with an approximately 50% duty cycle.

5. The gate driver circuit of claim 1 wherein said at least one pair of gate drive switching devices operates at a constant frequency.

6. The gate driver circuit of claim 1 wherein said at least one pair of gate drive switching devices operates at a variable frequency.

* * * * *